US008442456B2

(12) United States Patent
Beamish et al.

(10) Patent No.: US 8,442,456 B2
(45) Date of Patent: May 14, 2013

(54) WIRELESS COMMUNICATION UNIT, INTEGRATED CIRCUIT AND METHOD OF POWER CONTROL THEREIN

(75) Inventors: Norman Beamish, Cork (IE); Conor O'Keeffe, Cork (IE); Patrick Pratt, Mallow (IE); David Redmond, Cork (IE); Jacques Trichet, Cugnaux (FR)

(73) Assignee: Freescale Semiconductor, Inc., Austin, TX (US)

( * ) Notice: Subject to any disclaimer, the term of this patent is extended or adjusted under 35 U.S.C. 154(b) by 598 days.

(21) Appl. No.: 12/671,233

(22) PCT Filed: Aug. 9, 2007

(86) PCT No.: PCT/IB2007/054862
§ 371 (c)(1),
(2), (4) Date: Jan. 29, 2010

(87) PCT Pub. No.: WO2009/019541
PCT Pub. Date: Feb. 12, 2009

(65) Prior Publication Data
US 2010/0298035 A1    Nov. 25, 2010

(51) Int. Cl.
*H01Q 11/12* (2006.01)
*H04B 17/00* (2006.01)
*H04B 1/04* (2006.01)

(52) U.S. Cl.
USPC .............. 455/91; 455/115.1; 455/127.1

(58) Field of Classification Search .............. 455/91, 455/114.2–115.4, 126–127.2
See application file for complete search history.

(56) References Cited

U.S. PATENT DOCUMENTS

| | | | | |
|---|---|---|---|---|
| 5,303,268 A * | 4/1994 | Tsutsumi et al. | | 375/296 |
| 5,369,789 A * | 11/1994 | Kosugi et al. | | 455/126 |
| 5,504,457 A * | 4/1996 | Jensen | | 330/129 |
| 6,466,677 B1 | 10/2002 | Bush | | |
| 6,466,772 B1 | 10/2002 | Rozenblit et al. | | |
| 2001/0003434 A1* | 6/2001 | Mu et al. | | 330/207 P |
| 2003/0114124 A1* | 6/2003 | Higuchi | | 455/126 |
| 2003/0198300 A1* | 10/2003 | Matero et al. | | 375/297 |
| 2004/0137861 A1* | 7/2004 | Gentsch et al. | | 455/127.1 |
| 2006/0046763 A1* | 3/2006 | Schwent et al. | | 455/522 |
| 2007/0190952 A1* | 8/2007 | Waheed et al. | | 455/114.3 |

(Continued)

FOREIGN PATENT DOCUMENTS
EP    1463197 A    9/2004
EP    1526651 A    4/2005

OTHER PUBLICATIONS

International Search Report and Written Opinion correlating to PCT/IB2007/054862 dated Jun. 25, 2008.

*Primary Examiner* — Simon Nguyen (57) ABSTRACT

A wireless communication unit comprises a transmitter having a power amplifier and a feedback path operably coupled to the power amplifier. The feedback path comprises a coupler for feeding back a portion of a signal to be transmitted and a detector for detecting a power level of the fed back signal. A controller provides a ramp signal to the power amplifier that controls an amplitude characteristic of the signal to be transmitted. Averaging logic is operably coupled to the detector and arranged to average the detected power level over a first period. Comparison logic is operably coupled to the averaging logic and arranged to compare the average detected power level with a reference value. The controller is operably coupled to the comparison logic and arranged to scale a ramp signal applied to the power amplifier in response to the comparison.

20 Claims, 4 Drawing Sheets

U.S. PATENT DOCUMENTS

2007/0201580 A1* 8/2007 Kurakami et al. ............ 375/297
2007/0264947 A1* 11/2007 Rozenblit et al. .......... 455/127.2
2007/0287393 A1* 12/2007 Nandipaku et al. ........ 455/127.1
2008/0305756 A1* 12/2008 Kuriyama et al. ......... 455/127.2

* cited by examiner

WIRELESS COMMUNICATION UNIT, INTEGRATED CIRCUIT AND METHOD OF POWER CONTROL THEREIN

TECHNICAL FIELD

The technical field relates generally to a radio transmitter in a wireless communication unit. The technical field is applicable to, but not limited to, an integrated circuit and mechanism for power control of a radio frequency power amplifier.

BACKGROUND

Wireless communication systems, for example cellular telephony or private mobile radio communication systems, typically provide for radio telecommunication links to be arranged between a plurality of base transceiver stations (BTS), referred to as Node Bs with regard to a universal mobile telecommunication system (UMTS), and a plurality of subscriber units, often referred to as user equipment (UE) in UMTS.

In a cellular network, such as UMTS, the power transmitted by a UE is regulated in order to minimise interference with other UEs. Typically, the output power generated by the radio frequency (RF) power amplifier (PA) in the UE will vary due to any number, or combination, of factors, such as the manufacturing process, operating temperature, supply voltage, antenna loading and other such factors.

One feature associated with most wireless communication systems, which is particularly needed in a wireless cellular communication system, allows the transceivers in the Node B and UE to adjust their transmission output power to take into account a geographical distance between them. The closer the UE is to its serving Node B, the less power the UE and Node B's transceivers are required to transmit, for the transmitted signal to be adequately received by the other unit. This 'power control' feature saves battery power in the UE and also helps to reduce interference effects. Initial power settings for the UE, along with other control information, are set by information provided on, say, a beacon physical channel for a particular cell.

Furthermore, if an output power range is greater than that allowed by the system, then it is necessary to have feedback control of the PA to reduce the output power to an acceptable level. In this manner, it becomes necessary to measure the radio frequency transmit power at, or after, the PA output and to control a PA gain, typically by controlling the gain of amplifiers located earlier in the amplifier chain, in response to this measurement. A typical approach to PA power control is to measure DC power in the PA using a current sensing resistor. This DC power information is then used as feedback to control either the PA gain or the RF input power of the input to the PA. This feedback will allow power control regulation to compensate for variations in PA supply voltage, operating temperature & manufacturing process. This is often referred to as internal PA power control, being limited to the PA module itself. Thus, such power control limited to the PA module will not compensate for variations in the antenna loading (often referred to as mismatched load that deviates from an ideal matched load (i.e. VSWR=1:1).

In signal transmission, standing wave ratio (SWR), usually defined as a voltage ratio called the VSWR, is the ratio of the amplitude of a partial standing wave at an antinode (maximum) to the amplitude at an adjacent node (minimum), in an electrical transmission line. In a wireless communication unit, the VSWR performance is important at the Power amplifier to antenna node, where reflections can occur as a result of a mismatched load or an imperfection in an otherwise uniform transmission line between the antenna and the PA, or when a transmission line is terminated with other than its characteristic impedance. For example, this characteristic impedance of the antenna may change with a body of material placed physically near the antenna. Matched impedances provide a maximum power transfer; whereas mismatched impedances provide sub-optimal VSWR and thereby reduced power transfer to the antenna.

To facilitate compensation for VSWR variations external to the PA module, a directional coupler is placed between the PA output and the antenna input. In this manner, the directional coupler routes the coupled signal in a feedback path through a detector, which generates a signal proportional to the power transferred to the antenna, as present at its input. This feedback signal can then be processed and used by signal processing logic to control either the PA gain or power of the RF input signal to the PA.

If the detector output is used in a continuous-time loop to control the PA then the question of loop stability arises. The control loop must be stable over all possible variations in PA output power. The main advantage of employing a continuous-time loop is that changes in VSWR can be compensated for very quickly. The main disadvantage of employing this technique is that the control loop performance is strongly dependent on the PA characteristics. For a wireless system, where the wireless communication transceiver and the PA may both be sourced from different manufacturers, this often creates a logistical problem, as manufacturers are often not willing to divulge sufficient information to each other. Thus, power control circuits are typically PA module specific and need to be over-designed to accommodate for variations in PA module tolerances. Similarly, the cost of supporting multiple potential PAs within a single transceiver is impractical.

U.S. Pat. No. 6,466,772 discloses a continuous closed loop control system using a gain shaper element to improve linearity. The gain shaper characteristic must be designed to be reciprocal to the characteristic of the power amplifier. Therefore, this control approach is closely linked to the PA within the loop, which makes it unsuitable for use with multiple potential PAs.

Thus, there currently exists a need wireless communication unit, integrated circuit and method of performing power control in a transmitter, wherein the abovementioned disadvantages may be alleviated.

SUMMARY OF THE INVENTION

A wireless communication unit, an integrated circuit and a method of performing power control in a transmitter are described, as defined in the accompanying Claims.

Further aspects and features of the invention are as defined in the accompanying dependent Claims and are disclosed in the embodiments of the invention to be described.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the invention.

DESCRIPTION OF EMBODIMENTS OF THE INVENTION

Before describing in detail embodiments that are in accordance with the invention, it should be observed that the embodiments reside primarily in combinations of method steps and apparatus components related to a method of generating a power-controlled transmitter signal. Accordingly, the apparatus components and method steps have been represented where appropriate by conventional symbols in the drawings, showing only those specific details that are pertinent to understanding the embodiments of the invention so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

It will be appreciated that embodiments of the invention described herein may be comprised of one or more generic or specialized processors (or 'signal processors') such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and apparatus for performing power control described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Both the state machine and ASIC are considered herein as a 'signal processor' for purposes of the foregoing discussion and claim language.

Moreover, an embodiment of the invention can be implemented as a computer-readable storage element having computer readable code stored thereon for programming a computer (e.g., comprising a processing device) to perform a method as described and claimed herein. Examples of such computer-readable storage elements include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Generally speaking, the various embodiments provide a transmitter architecture that comprises a new arrangement and method for performing power control. The proposed transmitter architecture may, in some embodiments, solve a number of problems and/or provide a number of advantages over the known prior art. One assumption that has been recognised and utilised in one embodiment of the invention is that VSWR changes are often 'slow' relative to a timeslot/burst of a wireless communication unit's transmission, such as with respect to a GSM timeslot (577 μs).

Figure 1:
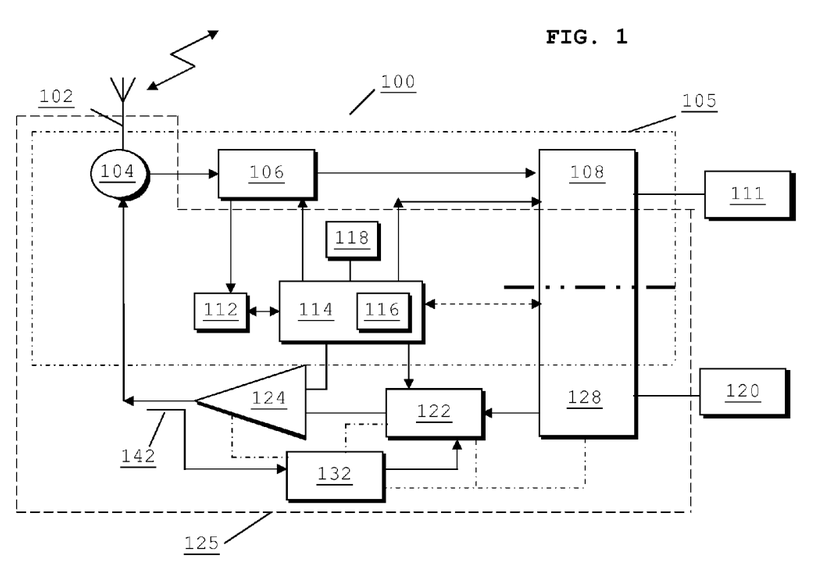
FIG. 1 illustrates a block diagram of a wireless communication unit in accordance with one embodiment of the invention.

Referring now to FIG. 1, a block diagram of a wireless communication unit 100 adapted to support the inventive concept of the invention, is illustrated. For the sake of clarity, the wireless communication unit 100 is shown as divided into two distinct portions: a receiver chain 105 and a transmitter chain 125.

The wireless communication unit 100 contains an antenna 102. The antenna 102 is coupled to an antenna switch 104 that provides signal control of radio frequency (RF) signals in the wireless communication unit 100, as well as isolation between the receiver chain 105 and transmitter chain 125. Clearly, the antenna switch 104 may be replaced in some embodiments of the invention with a duplex filter, for frequency duplex communication units as is known to those skilled in the art.

For completeness, the receiver 105 of the wireless communication unit 100 will be briefly described. The receiver 105 includes a receiver front-end circuit 106 (effectively providing reception, filtering and intermediate or base-band frequency conversion). The front-end circuit 106 is serially coupled to a signal processing function (generally realised by at least one digital signal processor (DSP)) 108. An output from the at least one digital signal processor 108 is provided to a user interface 111, which in a receiving context may comprise a suitable output device, such as a screen or loudspeaker. A controller 114 is operably coupled to the front-end circuit 106. A memory device 116 stores a wide array of data, such as decoding/encoding functions and the like. A timer 118 is operably coupled to the controller 114 to control the timing of operations, namely the transmission or reception of time-dependent signals.

As regards the transmit chain 125, this essentially includes an input device 120, such as a keypad, or microphone operably coupled to signal processing logic 128 and transmitter/modulation circuitry 122 and an up-converter/power amplifier 124. A skilled artisan will appreciate that the signal processing logic 128 in the transmit chain may be implemented as distinct from the at least one digital signal processor 108 in the receive chain. Alternatively, a single processor may be used to implement processing of both transmit and receive signals, as shown in FIG. 1.

In accordance with embodiments of the invention, as described hereafter, the signal processing logic 128, transmitter/modulation circuitry 122 and the up-converter/power amplifier 124 are operationally responsive to the controller 114, with an output from the power amplifier 124 coupled to the antenna switch 104. A feedback circuit includes a detector (not shown) and down-converter 132, which together with the transmitter/modulation circuitry 122, power amplifier 124 and a directional coupler 142, forms a closed feedback loop.

In accordance with embodiments of the invention, a controller 114 is arranged to process the average power information from the directional coupler 142 and detector to estimate the VSWR condition at the antenna. Furthermore, the controller uses this information to scale the transmitted power by applying a scaling factor to a stored ramp profile characteristic, as described later with respect to FIG. 2.

The following embodiments illustrate performing power control in a transmitter of a wireless communication unit in accordance with the GSM specification. However, it is envisaged that the inventive concept may be equally applied to any TDMA burst structure.

Furthermore, it is envisaged that the inventive concept may be applied to a non-TDMA burst structure. In such a non-TDMA burst embodiment, it is envisaged that, in contrast to utilising the GSM bursts to provide a natural measurement interval, it is possible in a non-bursty system to define measurement periods that are analogous to the burst measurement periods used in the GSM embodiment described. In such an embodiment, the controller 114 may be operably coupled to the comparison logic and arranged to scale an amplitude control signal (equivalent to the ramp signal in a burst-mode system) applied to the power amplifier 124, in response to the comparison.

Thus, in the context of this invention, the term ramp signal in a burst-mode application encompasses any control of the amplitude of the transmitted signal, for example in a GSM system the amplitude change during a transition (ramp-up) from zero to target power at a start of the burst and during a transition back down to zero at an end of the burst. The term 'ramp signal', in a non-burst mode application, is envisaged as encompassing any amplitude control signal that controls how the amplitude of the transmitted signal will change over the course of a transmission.

To close the power control loop within the transmitter circuitry, rather than the PA module itself, it is necessary to connect the output of the power detector to the transmitter/modulation circuitry 122.

Figure 2:
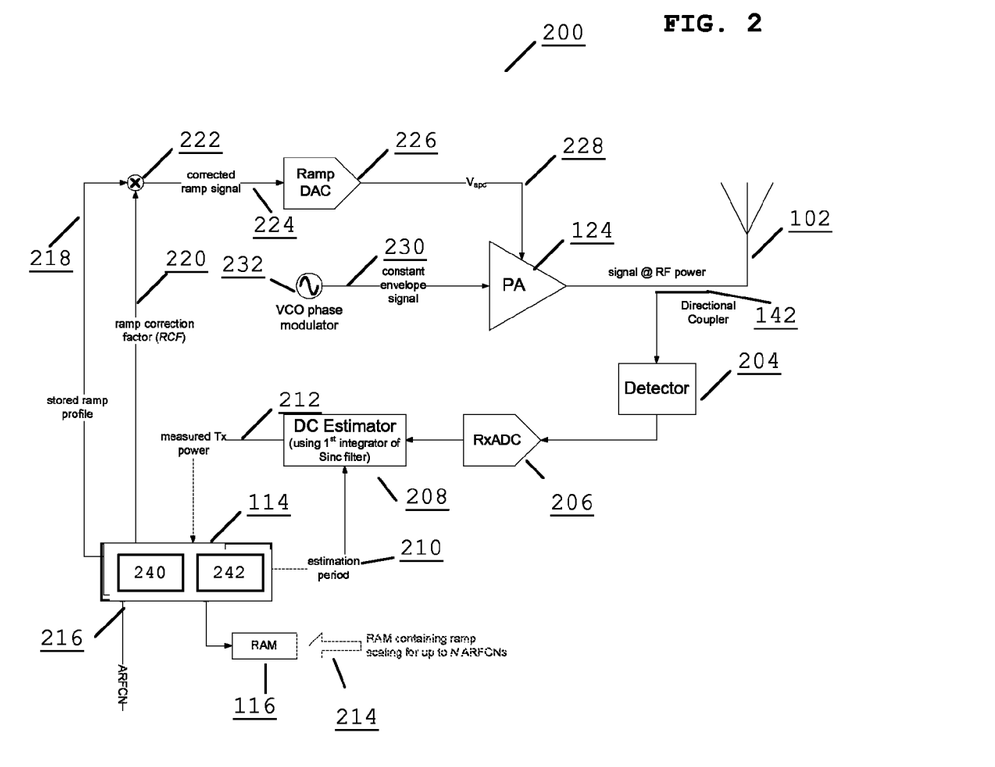
FIG. 2 illustrates a block diagram of a power control circuit of a wireless communication unit in accordance with one embodiment of the invention.

FIG. 2 illustrates a block diagram of a power control circuit 200 of a wireless communication unit in accordance with one embodiment of the invention. In this embodiment, the RF PA 124 receives a constant envelope modulation signal 230 from a phase modulated voltage controlled oscillator (VCO) 228. The performance of the PA 124 is controlled by a power control voltage 227 Vapc. The RF high power output from the PA 124 is fed to the antenna 102. A portion of the RF high power output is coupled into a feedback path by directional coupler 142 into detector 204. The output of the detector 204, which is in an analogue form, is input to, for example, a receiver analogue-to-digital converter (ADC) 206 to provide a digital representation of the RF high power output signal.

In an alternative embodiment of the invention, it is envisaged that the ADC may be a distinct, stand-alone ADC to function as part of the feedback loop, and thus the inventive concept would not reuse the wireless communication unit's receiver ADC.

The digital representation output from the ADC 206 is input to signal processing logic 208 to provide a DC estimation of the output of the ADC 206. A DC estimator is a lowpass filter, which typically has a very narrow passband. The purpose of the DC estimator is to remove noise on the input signal and to provide at its output the average level of the input. In one embodiment, the DC estimation may use a first integrator of a sinc filter. A sinc filter (also known as a cascaded integrator comb filter) is a form of lowpass filter that can be efficiently implemented in hardware. A sinc filter is well known to those skilled in the art, for example as described in IEEE Transactions on Acoustics, Speech and Signal Processing, Vol. 29, pp 155-162, and will therefore not be described further here.

The output from the signal processing logic 208, which calculates a direct current (DC) estimation, is a representation of the measured transmit power 212. In this regard, the detector 204 generates a DC signal at its output that is correlated to the power level of the RF signal at its input. This is input to the controller 114. In one embodiment, as illustrated in FIG. 2, the controller 114 comprises averaging logic 240 operably coupled to comparison logic 242. It is envisaged in alternative embodiments that the averaging logic 240 and comparison logic 242 may be implemented as a single logic element or integrated circuit that compares during an averaging period & output the average result of the comparison. Also, it is envisaged in a further alternative embodiment that the averaging logic 240 and comparison logic 242 may be located separate from the controller 114, as would be appreciated by a skilled artisan.

The averaging logic 240 then averages the detector output over an estimation period 210, which in one embodiment of the invention is a subset of an active burst period. It is envisaged that a typical range for the subset may be a flat portion of the burst, as depicted by line 418 in FIG. 4. This might be a useful range because during this period the transmitted power is ideally constant, whereas the power variation during the ramp-up and ramp-down periods 416, 420 might bias the power estimation process.

The controller 114 in one embodiment, or the averaging logic 240 in an alternative embodiment, then calculates an average transmit power level value, which is compared with a target value (for example a value representative of when the voltage standing wave ratio is minimal, i.e. a matched load where VSWR=1.0). The ratio of the two values is calculated, and referred to hereinafter as a Ramp Correction Factor (RCF) 220. The RCF is stored in the transceiver memory 116, and preferably associated with a transmit Absolute Radio Frequency Channel Number (ARFCN) value 216. Absolute Radio Frequency Channel Numbers (ARFCN) is a channel numbering scheme used to identify specific RF channels in a GSM radio system.

In one embodiment of the invention, it is envisaged that when a transmit burst is scheduled for transmission a desired power output (P0) level & ARFCN 216 will be made available. The controller 114 selects a stored ramp profile 218 based on the parameters P0 & ARFCN 216. A ramp profile defines an amplitude control signal that controls how the amplitude of the transmitted signal will change over the course of the burst period. Typically, in GSM systems, the transmitted amplitude control signal is often referred to as a ramp signal. In one embodiment of the invention, the PA module 124 has an internal power control loop that compensates for variation in manufacturing, supply voltage and temperature, as known in the art.

However, in accordance with embodiments of the invention, the controller 114 also supports an external power control loop arranged to compensate for variations in VSWR. To compensate for variations in VSWR the controller applies a RCF 220 value to scale a stored ramp profile 218 before it is sent to the PA 124. The scaling operation is performed in mixing logic 222, which receives respective inputs of the RCF 220 value and a stored ramp profile 218. Thus, the signal output from the mixing logic 222 is representative of a corrected ramp signal 224, which is input to a (ramp) digital-to-analogue converter (DAC) 226.

Figure 4:
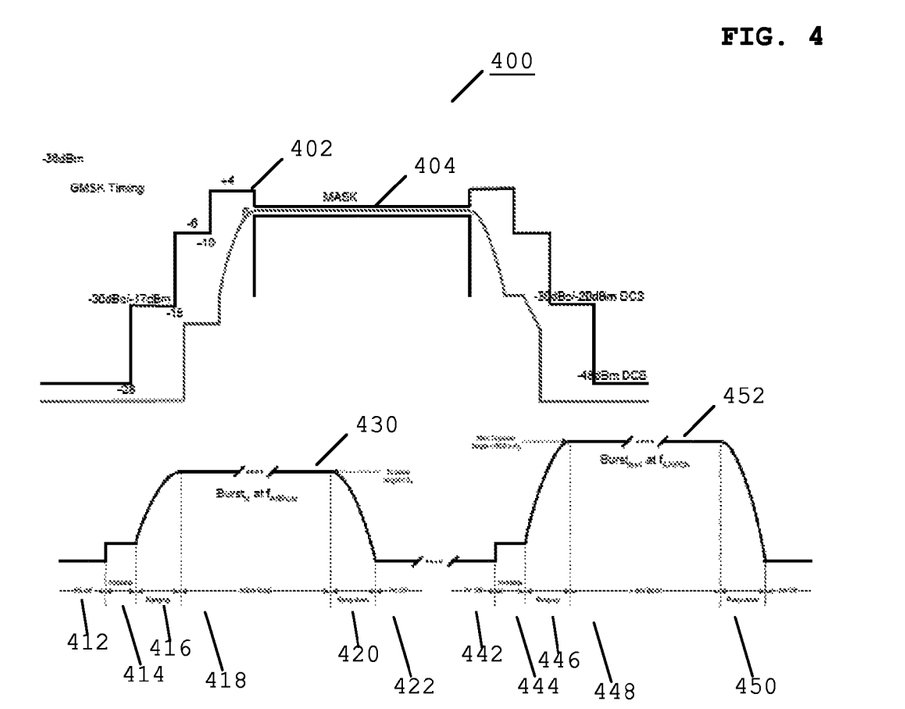
FIG. 4 illustrates a power-time mask of a transmitter of a wireless communication unit in accordance with one embodiment of the invention.

The output signal from the DAC 226 is then applied to the power amplifier to ensure that the high power RF signal output from the antenna 102 of the wireless communication unit meets the desired power-time mask, as shown in FIG. 4.

In one embodiment of the invention, it is envisaged that the RCF 220 may be calculated in a variety of ways. The RCF 220 may be computed from measurements of transmit power level, fed back via the feedback path and performed on the preceding transmit burst.

Alternatively, the RCF 220 may be averaged over N previous transmit bursts. In one embodiment of the invention, it is envisaged that there may be one RCF 220 for each ARFCN 216.

Alternatively, it is envisaged that there may be one RCF 220 for a plurality (say, blocks) of ARFCN 216. In one embodiment of the invention, it is envisaged that this latter option may involve analysing expected VSWR variation versus frequency. Typically it would be expected that VSWR would exhibit some dependency on frequency. This raises a possibility that the RCF 220 can be calculated for a range of contiguous ARFCN. In accordance with embodiments of the invention, advantages of this approach may comprise:
  (i) Using a range of ARFCN, which allows more Tx bursts to be used in determination of the RCF. Hence, convergence will be faster.
  (ii) The digital storage requirements are reduced as it is not necessary to store an RCF for every possible ARFCN.

To reduce transceiver costs, rather than allocating storage for every ARFCN, it is envisaged that storage may be allocated for the M most common ARFCNs 216. It is envisaged that this list of ARFCNs 216 may be dynamically updated to reflect movement of the wireless subscriber communication unit through the cellular network.

In one embodiment of the invention, it is envisaged that a range of RCF values may also be limited, for example limiting the range to within 85%<->115% of a reference or typical value. In this embodiment, restricting a range of RCF values may be implemented to reflect limitations of the ramp DAC. Typically, this implementation would be performed during a design phase. Generally radio specifications for a transmitter are relaxed for lower RF output powers. Thus, it is known that performance limitations happen at higher signal powers where the PA control loop would tend to approach saturation.

Figure 3:
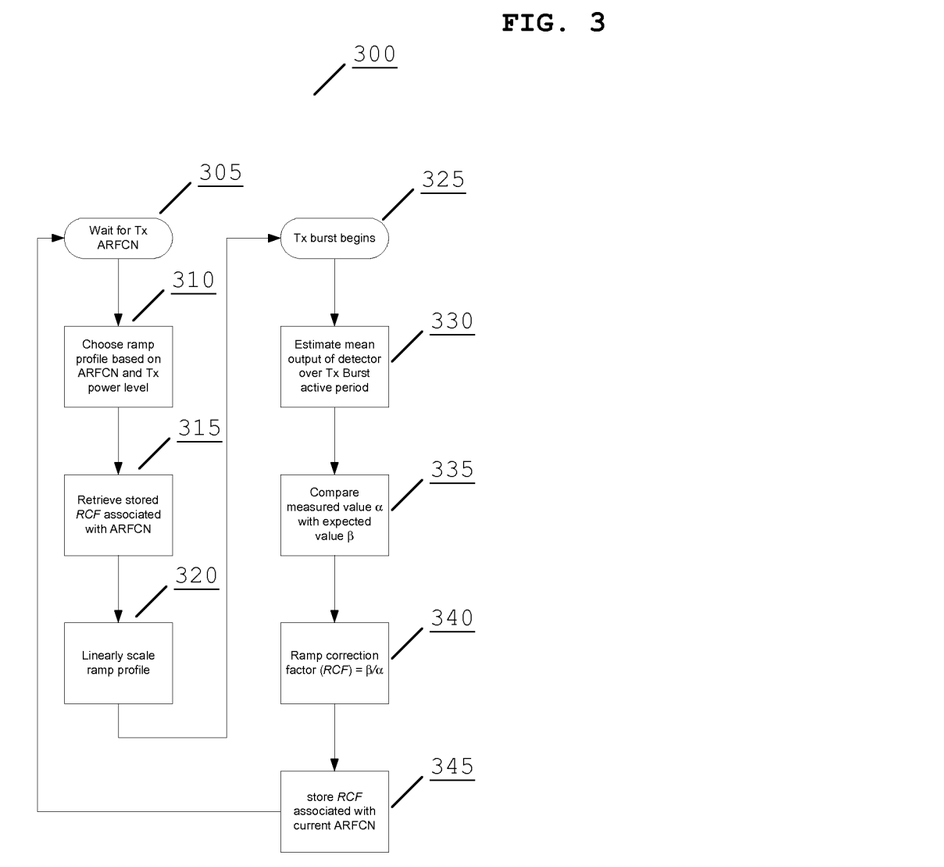
FIG. 3 illustrates a flowchart of a method of power control in accordance with one embodiment of the invention.

FIG. 3 illustrates a flowchart 300 of a method of power control in accordance with one embodiment of the invention. The method starts in step 305 with the wireless communication unit waiting for a transmit ARFCN request. In this regard, a baseband controller IC may inform the transceiver IC that it wants to send a burst of data over a frequency channel, as defined by the ARFCN. Once an ARFCN request has been received, and a transmit power level selected, a ramp profile is selected by the controller say controller 114 of FIG. 1, based thereon, as shown in step 310. A controller, for example controller 114, retrieves a stored RCF value from memory, with the stored RCF value preferably being associated with a corresponding ARFCN (or plurality of AFCNs), as in step 320.

The controller then selects a scaling value to apply to the selected ramp profile. In one embodiment of the invention, the scaling value is applied in a linear manner. A transmit burst then commences in step 325.

The controller (or averaging logic) then estimates an average output of a detector, over a time period, for example a transmit burst active period or portion thereof, as shown in step 330. The controller (or comparison logic) then compares a measured value of $\alpha$ representative of the detected output power level with an expected $\beta$ value for the output power level, as shown in step 335. The controller then applies a ramp correction factor (RCF), for example in a form of a:

$$\text{scaling factor} = \mu/\alpha, \quad [1]$$

as shown in step 340. In one embodiment of the invention, the controller stores the RCF value and associates the RCF value with a current ARFCN value, as shown in step 345. The process then loops back to step 305 and the controller waits for a transmit ARFCN change.

In one embodiment of the invention, for example with respect to an implementation in a wireless communication unit that supports GSM communication, it is envisaged that the inventive concept may be utilised by a Network Operator employing frequency hopping. In this context, a GSM transmitter will typically transmit on multiple channels during the course of a phone call. The transmitter knows what channels it is transmitting on and when it is doing so.

Thus, when a power level measurement (equivalent to a VSWR estimation) is made the measurement/estimation can be associated with the ARFCN being used by the GSM transmitter.

In one embodiment of the invention, this power level measurement/VSWR estimate is stored and thereafter, the next time the GSM transmitter is instructed to transmit at that ARFCN, it consults, say, its VSWR table and recalls the previous estimate. Therefore, during the course of a frequency hopping phone call, it is envisaged that the GSM transmitter would carry out this procedure for multiple ARFCN, as illustrated in FIG. 2. In this embodiment, the detector merely generates an estimate of the transmitted power at the current ARFCN. As the ARFCN changes the detector will still provide an estimate of the current transmitted power, but now it will correspond to the new ARFCN.

In one embodiment of the invention, it is envisaged that a burst window may be observed to measure the transmit power level or estimate a VSWR performance, rather than dynamically regulate the measurement across a number of frames or slots. Again, it is envisaged that any movement away from a desired transmit level, say due to a non-ideal VSWR performance, may be compensated for, say on a subsequent time slot or time frame or burst by applying a correction factor to the ramp signal.

In one embodiment of the invention, in a time division multiple access (TDMA) system, it is known that the receiver path of the wireless communication unit may be reused to process the signal from the detector. In the Global System for Mobile Communications (often referred to as the GSM standard), a Gaussian mean shift keyed (GMSK) modulation scheme is used. In this scheme, during an active transmit burst, the transmit power is constant and the transmitter ramp profile (i.e. the output power versus time relationship of the power amplifier) is flat. FIG. 4 illustrates a power-time mask 402 of a transmitter of a wireless communication unit, whose ramp profile 404 is adapted in accordance with such an embodiment of the invention.

FIG. 4 further illustrates how the ramp profile is scaled in accordance with one embodiment of the invention. The profile commences with the PA being switched off 412, and an initial period in the ramp profile allocated to kick-start the PA ramp process 414. A ramp-up operation 416 of the PA output is then initiated according to a particular ramp profile, and when the transmit power reaches a target power level 430, a transmit burst (N), at a particular ARFCN frequency, becomes active 418. Data is then transmitted. After the burst transmission has completed, the PA profile ramps down 420 and the PA turns 'off' 422. In accordance with the embodiment described above, based on the feedback from the detector, the RCF is calculated by comparing the actual transmitted power versus the desired transmitted power. The RCF is then applied to scale the ramp profile.

Thus, following a controller selecting a new RCF value, a stored ramp profile is scaled accordingly. The updated ramp profile therefore commences again with the PA being 'off' 442, and an initial period in the ramp profile allocated to kick-start the PA ramp process 444. A ramp-up operation 446 of the PA output is then initiated according to a newly scaled ramp profile. When the transmit power reaches its new target power level 452, the burst (N) at a particular ARFCN frequency becomes active 448. After the burst transmission has completed, the PA profile ramps down 450 and the PA turns 'off'. In this manner, the ramp profile may be adjusted according to VSWR changes noted at the antenna.

In accordance with one embodiment of the invention, any slow variation in VSWR will be compensated for. For example in a context of a GSM burst architecture, a 'slow' variation may be regarded as operating environmental changes, battery voltage, temperature or physical placement of the wireless communication unit in a vicinity of an electromagnetic field loading body. For example, in one embodiment of the invention, it is considered that a 'slow' variation may encompass, say, events that occur over a number of GSM frames e.g. 25-100 frames.

Thus, in a communication environment where VSWR changes slowly (for example when a wireless subscriber communication unit is located on or near a metallic object, or with a pedestrian user) employing the inventive concept enables control of the transmitted power to compensate for the change in VSWR.

Thus, and advantageously, the inventive concept allows a transceiver, for example one employed in a GSM system, to compensate for VSWR variations, irrespective of whichever PA from a wide range of available industry PAs, is used. Hence, the power control loop within the PA module is effectively decoupled from the VSWR compensation.

Furthermore, it is within the contemplation of the invention that the wireless communication unit configured to employ the power control method as hereinbefore described may be any wireless communication device, such as a portable or private mobile radio (PMR), a mobile phone, a personal digital assistant, a wireless laptop computer, etc. It is also envisaged that the inventive concept described herein is not limited to use in subscriber equipment, but may also be utilised in other communication units such as base station equipment.

Thus, in accordance with embodiments of the invention, a digital transmitter control loop (e.g. an external loop compared to a PA internal control loop) is arranged to compensate for output power variations of a power amplifier due to VSWR changes identified at the antenna (for example due to load variations at the antenna) presented to the RF power amplifier operating under open loop control.

In one embodiment of the invention the receive path is re-used in a transmitter operation to measure the transmit power during a fraction of the active burst. In this embodiment, an estimated value, effectively a measurement of the actual transmitted power as provided by the power detector/DC estimator, is then compared with a stored reference value corresponding to an ideal load case (VSWR=1:1). A signal that is proportional to the ratio of these values is generated (termed Ramp Correction Factor) and used to scale the power control signal to be applied to the PA for the next transmit burst. Thus, in this embodiment, the proposed scheme is adaptive to the changing communication environment.

It will be understood that the wireless communication unit, integrated circuit and method of performing power control in a transmitter, as described above, tend to provide at least one or more of the following advantages:
- (i) The inventive concept may enable a transceiver in a wireless communication unit supporting GSM or any TDMA based communication protocol to compensate for VSWR variations, irrespective of the PA employed by the wireless communication unit.
- (ii) The inventive concept is not limited to a particular PA or PA topology and may be applied with a wide range of PAs.
- (iii) The internal control loop within the PA module is effectively decoupled from the VSWR compensation effected within the transceiver.
- (iv) The power control architecture may support slow VSWR variations, as output power variations are considered slow relative to a measurement period, for example a GSM frame period.
- (v) The inventive concept may preclude a need to implement a fast control loop.
- (vi) The inventive concept may preclude a need to implement additional power control circuitry (such as multiple drivers and critical design components (e.g. R3-R4) (as proposed in U.S. Pat. No. 6,466,677) inside a PA module, by using standard open loop PA (thereby lower cost). This leads to an ability to use a smaller die size for the PA.

Those skilled in the art will realize that the above recognized advantages and other advantages described herein are merely exemplary and are not meant to be a complete rendering of all of the advantages of the various embodiments of the invention.

In the foregoing specification, specific embodiments of the invention have been described. However, one of ordinary skill in the art appreciates that various modifications and changes can be made without departing from the scope of the invention as set forth in the claims below.

Accordingly, the specification and figures are to be regarded in an illustrative rather than a restrictive sense, and all such modifications are intended to be included within the scope of invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Moreover in this document, relational terms such as first and second, top and bottom, and the like may be used solely to distinguish one entity or action from another entity or action without necessarily requiring or implying any actual such relationship or order between such entities or actions.

The terms 'comprises', 'comprising', 'has', 'having', 'includes', 'including', 'contains', 'containing' or any other variation thereof, are intended to cover a non-exclusive inclusion, such that a process, method, article, or apparatus that comprises, has, includes, contains a list of elements does not include only those elements, but may include other elements not expressly listed or inherent to such process, method, article, or apparatus. An element proceeded by 'comprises . . . a', 'has . . . a', 'includes . . . a', 'contains . . . a' does not, without more constraints, preclude the existence of additional identical elements in the process, method, article, or apparatus that comprises, has, includes, contains the element. The terms 'a' and 'an' are defined as one or more, unless explicitly stated otherwise herein.

The terms 'substantially', 'essentially', 'approximately', 'about' or any other version thereof, are defined as being close to as understood by one of ordinary skill in the art. The term 'coupled' as used herein is defined as connected, although not necessarily directly and not necessarily mechanically. A device or structure that is 'configured' in a certain way is configured in at least that way, but may also be configured in ways that are not listed.

Thus, a wireless communication unit, an integrated circuit and a method of performing power control in a transmitter have been described that substantially address the problems associated with known transmitters.

The invention claimed is:

1. A wireless communication unit comprising:
   a transmitter having a power amplifier and a feedback path operably coupled to the power amplifier, wherein the feedback path comprises a coupler for feeding back a portion of a signal to be transmitted, a detector for detecting a power level of the fed back signal and a controller for providing a ramp signal to the power amplifier that controls an amplitude of the signal to be transmitted;
   averaging logic operably coupled to the detector and arranged to average the detected power level over a first period, the first period including multiple bursts; and
   comparison logic operably coupled to the averaging logic and arranged to compare the average detected power level with a reference value;
   wherein the controller scales the ramp signal applied to the power amplifier in response to the comparison.

2. The wireless communication unit of claim 1 wherein the reference value is based on a voltage standing wave ratio (VSWR).

3. The wireless communication unit of claim 2 wherein the reference value is based on an ideal voltage standing wave ratio (VSWR).

4. The wireless communication unit of claim 1 wherein the controller compensates output power variations of the power amplifier in response to a transmit frequency of the wireless communication unit.

5. The wireless communication unit of claim 4 comprising a memory element arranged to store at least one of the detected power levels or a scaling factor associated with the transmit frequency.

6. The wireless communication unit of claim 5 wherein the controller accesses the memory element to determine a ramp scaling factor to be applied to the power amplifier for a transmit channel frequency to be used by the wireless communication unit.

7. The wireless communication unit of claim 4 wherein that the memory element stores a ramp scaling factor for respective multiple different channel frequencies transmitted by the wireless communication unit.

8. The method of claim 4 wherein the scaling comprises:
   determining a range of frequencies; and
   determining a single scaling factor applicable for each frequency in the range of frequencies.

9. The method of claim 4 wherein the scaling comprises:
   selecting M most common frequencies, wherein M is a positive integer;
   determining a scaling factor for each frequency of the M most common frequencies; and
   storing the scaling factor for each frequency of the M most common frequencies in non-volatile storage.

10. The method of claim 4 wherein the scaling comprises determining a scaling factor for each channel in the channels over which the transceiver transmits.

11. The wireless communication unit of claim 1 wherein the controller linearly scales the ramp signal applied to the power amplifier.

12. The wireless communication unit of claim 1 wherein at least one of the averaging logic or comparison logic is located in a receiver chain of the wireless communication unit.

13. The wireless communication unit of claim 1 wherein the wireless communication unit is a subscriber communication unit.

14. The method of claim 1 wherein the averaging logic comprises a first integration of a sinc filter.

15. The method of claim 1 wherein the scaling comprises limiting the scaling of the power amplifier to a range between 85% and 115% of the detected power level of the feedback signal.

16. The method of claim 1 wherein the scaling comprises:
   scaling a ramp profile stored externally to the power amplifier; and
   sending the scaled ramp profile to the power amplifier.

17. An integrated circuit for performing power control of a wireless communication unit comprising a transmitter having a power amplifier and a feedback path operably coupled to the power amplifier, wherein the feedback path comprises a coupler for feeding back a portion of a signal to be transmitted, the integrated circuit comprising:
   a detector for detecting a power level of the fed back signal; and
   a controller for providing a ramp signal to the power amplifier that controls an amplitude characteristic of the signal to be transmitted by the power amplifier;
   averaging logic operably coupled to the detector and arranged to average the detected power level over a first period;
   comparison logic operably coupled to the averaging logic and arranged to compare the average detected power level with a reference value; and wherein the controller scales the ramp signal applied to the power amplifier in response to the comparison in a subsequent second burst period, wherein the ramp signal scaling varies in response to a transmit frequency of the wireless communication unit, the scaling comprising:
      analyzing expected voltage standing wave ratio variation versus frequency; and
      calculating a ramp correction factor for a range of contiguous absolute radio frequency channel numbers.

18. A method of power control in a wireless communication unit comprising a transmitter having a power amplifier and a feedback path operably coupled to the power amplifier, wherein a controller provides a ramp signal to the power amplifier that controls an amplitude characteristic of the signal to be transmitted, wherein the method comprises:
   feeding back a portion of a signal to be transmitted,
   detecting a power level of the fed back signal;
   averaging the detected power level over at least a portion of a first burst period;
   comparing the average detected power level with a reference value; and
   scaling the ramp signal applied to the power amplifier by the controller in response to the comparison, wherein the scaling comprises:
      selecting M most common transmit frequencies of the wireless communication unit, wherein M is a positive integer;
      determining a scaling factor for each frequency of the M most common frequencies; and
      storing the scaling factor for each frequency of the M most common frequencies in non-volatile storage.

19. The method of claim 18 wherein the averaging logic comprises a first integration of a sinc filter.

20. The method of claim 18 wherein the scaling comprises limiting the scaling of the power amplifier to a range between 85% and 115% of the detected power level of the feedback signal.

* * * * *